United States Patent
Yu

(12) 
(10) Patent No.: US 6,341,070 B1
(45) Date of Patent: Jan. 22, 2002

(54) WAFER-SCALE PACKING PROCESSES FOR MANUFACTURING INTEGRATED CIRCUIT (IC) PACKAGES

(76) Inventor: Ho-Yuan Yu, 19308 Vendura Ct., Saratoga, CA (US) 95070

( * ) Notice: Subject to any disclaimer, the term of this patent is extended or adjusted under 35 U.S.C. 154(b) by 0 days.

(21) Appl. No.: 09/363,071

(22) Filed: Jul. 28, 1999

Related U.S. Application Data

(60) Provisional application No. 60/094,398, filed on Jul. 28, 1998.

(51) Int. Cl.[7] ................................................. H05K 3/40
(52) U.S. Cl. .................. 361/760; 361/748; 361/764; 361/765; 361/807; 257/620; 257/774; 257/686; 174/260; 174/266
(58) Field of Search ............................... 361/760, 748, 361/764, 765, 807, 820; 174/266, 260; 257/620, 774, 684, 685, 686; 438/460, 18

(56) References Cited

U.S. PATENT DOCUMENTS

| | | | | |
|---|---|---|---|---|
| 5,051,807 A | * | 9/1991 | Morozumi | 257/620 |
| 5,552,345 A | * | 9/1996 | Schrantz et al. | 438/460 |
| 5,801,448 A | * | 9/1998 | Ball | 257/778 |
| 5,844,304 A | * | 12/1998 | Kata et al. | 257/620 |
| 5,899,729 A | * | 5/1999 | Lee | 438/460 |
| 5,926,380 A | * | 7/1999 | Kim | 361/813 |
| 6,002,168 A | * | 12/1999 | Bellaar et al. | 257/696 |
| 6,051,875 A | * | 4/2000 | Dando | 257/632 |
| 6,075,280 A | * | 6/2000 | Yung et al. | 257/620 |
| 6,117,707 A | * | 9/2000 | Badehi | 438/113 |

* cited by examiner

Primary Examiner—Leo P. Picard
Assistant Examiner—David Foster
(74) Attorney, Agent, or Firm—Bo-In Lin

(57) ABSTRACT

This invention discloses a wafer level packaging method and configuration. This improved wafer level package includes a processed wafer mounted on a first printed circuit board (PCB) carrier. The processed wafer mounted on the PCB carrier board includes a plurality of separated integrated circuit (IC) chips divided by scribe-line gaps wherein each of these scribe-line gaps is filled with flexible gap-filling insulation material. In another preferred embodiment, the wafer-level package further includes a second PCB carried board composed of same material as the first PCB carrier board mounted on top of the wafer. In another preferred embodiment, the wafer-level package, which having the first and the second PCB carrier boards further includes a plurality of connection via penetrating through the first and the second PCB carried board for forming electric connection to the IC chips separated by the scribe-line gaps.

20 Claims, 2 Drawing Sheets

WAFER-SCALE PACKING PROCESSES FOR MANUFACTURING INTEGRATED CIRCUIT (IC) PACKAGES

This Application claims a Priority Date of Jul. 28, 1998, benefited from a previously filed Provisional Application No. 60/094,398 filed on Jul. 28, 1998 by a same Inventor of this Patent Application.

BACKGROUND OF THE INVENTION

1. Field of the Invention

This invention relates generally to the structure and fabrication process for packaging the integrated circuit (IC) devices formed on a semiconductor substrate. More particularly, this invention relates to a novel fabrication process where chip scale connection and packaging processes in a conventional method are now replaced by wafer scale packaging processes. Simplified production techniques with time and cost savings are achieved.

2. Description of the Prior Art

Conventional processes for producing the integrated circuit (IC) packages are often performed after the die separation even though time and cost savings can be achieved by carrying out wafer scale packaging process before the die separation. This is due to the concerns that when a wafer is mounted on a board, a thermal cycle may cause damages to the wafer. This difficulty is caused by the different coefficients of the thermal expansion between the wafer and the board upon which the IC chip is mounted. The stress caused by the difference in thermal expansion can break a wafer. Due to this difficulty, the benefits of carrying out a wafer-scale packaging process to achieve time and costs saving s cannot be realized. Instead, in a conventional process, the wafers are first divided into hundreds or thousands of dies, and the packaging processes are performed on each individual chip. Additional efforts are required to handle so many individual chips and duplicated processing steps that take more times and labors are necessary to carry out the packaging processes on each chip. Conventional packaging technology does not offer an effective solution to circumvent the concerns that a delicate wafer may be damaged when mounted on a carrier for further packaging processes when there are differences in thermal expansion coefficients.

Therefore, a need still exits in the art of integrated circuit (IC) package to provide a novel structural configuration and fabrication process that would resolve these difficulties. More specifically, it is preferably that a wafer scale packaging process can be conveniently performed without requiring additional complicated processing steps. It is further desirable to employ regular manufacture process commonly applied to reduce the production costs such that IC packages of high quality with high performance can be economically produced.

SUMMARY OF THE PRESENT INVENTION

It is therefore an object of the present invention to provide a new wafer level packaging method and configuration wherein stress imposed on the wafer caused by differences of thermal expansion is minimized such that aforementioned limitations and difficulties as encountered in the prior art can be overcome.

Specifically, it is an object of the present invention to provide a new wafer level packaging method and configuration. The wafer is first mounted on a mounting and packaging carrier. The stress imposed on the wafer caused by differences of thermal expansion between the wafer and the mounting carrier is minimized by providing chipisolation and stress relief configuration either on the wafer or on the chip-mounting carrier. The stress induced from differences in thermal expansion when carrying out the wafer-level packaging processes is relieved without transferring to the wafer.

Another object of the present invention is to provide a new wafer level packaging method and configuration. The wafer is first mounted on a mounting and packaging carrier. The wafer is then divided into individual chips by sawing the wafer along the predefined scribe lines and filled with flexible gap-filling and insulation materials. The stress imposed on the wafer caused by differences of thermal expansion between the wafer and the mounting carrier is minimized by providing chip-isolation and stress relief configuration with gaps between the chips filled with flexible gap-filling materials. The stress induced from differences in thermal expansion when carrying out the wafer-level packaging processes is relieved without transferring to the wafer.

Another object of the present invention is to provide a new wafer level packaging method and configuration. The wafer is first mounted on a mounting and packaging carrier, e.g., a rigid interposer. The rigid interposer is provided with chip stress-relief and isolation means having open trenches along the edges of areas under each individual chip. The stress imposed on the wafer caused by differences of thermal expansion between the wafer and the mounting carrier is isolated and relieved with the open trenches allow flexibility of expansions. Under-fill materials provided between the wafer and the rigid interposer also absorbs the stress. The stress induced from differences in thermal expansion when carrying out the wafer-level packaging processes is relieved without transferring to the wafer.

Briefly, in a preferred embodiment the present invention discloses a wafer level packaging method and configuration. This improved wafer level package includes a processed wafer mounted on a first printed circuit board (PCB) carrier. The processed wafer mounted on the PCB carrier board includes a plurality of separated integrated circuit (IC) chips divided by scribe-line gaps wherein each of these scribe-line gaps is filled with flexible gap-filling insulation material. In another preferred embodiment, the wafer-level package further includes a second PCB carried board composed of same material as the first PCB carrier board mounted on top of the wafer. In another preferred embodiment, the wafer-level package, which having the first and the second PCB carrier boards further includes a plurality of connection via penetrating through the first and the second PCB carried board for forming electric connection to the IC chips separated by the scribe-line gaps.

The present invention further discloses a method for carrying out a wafer-level packaging manufacturing process. The method includes the steps of (a) mounting a processed wafer onto a first printed circuit board (PCB) carrier; (b) dividing the processed wafer into a plurality of integrated circuit (IC) chips by opening a plurality of scribe-line gaps between each of the IC chips; (c) filling each of the scribe-line gaps with flexible gap-filling insulation material; (d) mounting a top PCB carrier board on top of the processed wafer composed of identical material as that of the first PCB carrier board; and (d) forming a plurality of via-connections by opening a plurality of vias penetrating the first and the second PCB carrier boards and filling the vias with conductive material for electrically connecting to the separated IC chips.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
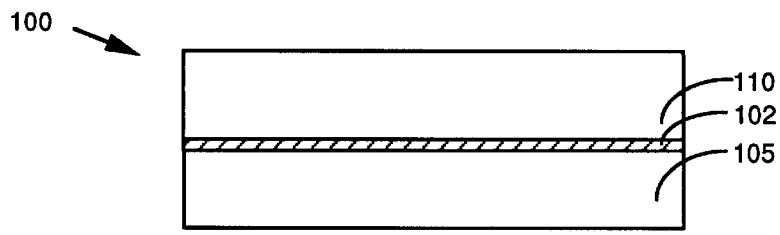
FIGS. 1A to 1E are a series of cross-sectional views for illustrating the processing steps of wafer level packaging of IC devices according to method and configuration disclosed by this invention.
Figure 1B:
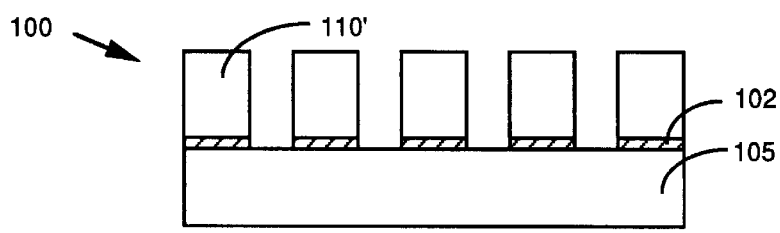

FIGS. 1A to 1E is are a series of cross sectional views for illustrating the processing steps in carrying out the packaging processes on a wafer scale for fabricating a plurality of integrated circuit (IC) discrete devices, i.e., IC chips. In FIG. 1A, a processed wafer 110 ready for carrying out a packaging process thereon is mounted to a printed circuit board 105 via an adhesive or bonding layer 102. The printed circuit board 105 is about the same size as the processed wafer 110. In FIG. 1B, a dicing saw is applied to saw the wafer 110 along a plurality of scribe lines to separated the wafer 110 into a plurality of chips 110'. These scribe lines are usually preformed on the processed wafer 110. Depending on particular design considerations for specific applications, the separation-slots sawed between these separated chips 110' can be slots having a width ranging between 5 to 20 mils.

Figure 1C:
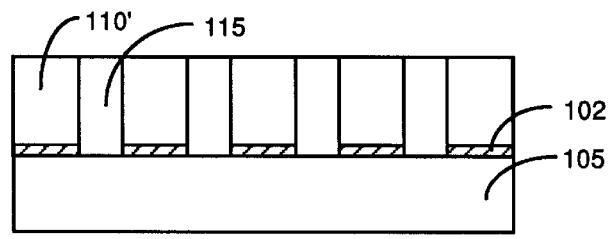
Figure 1D:
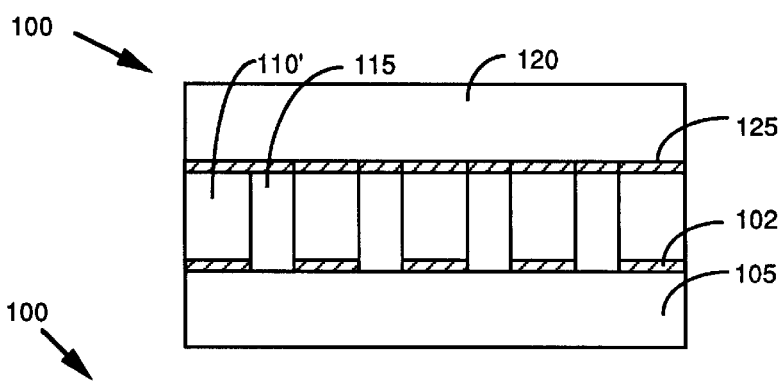

In FIG. 1C, the slots are filled with a gap-filler 115. The gap filler can be materials such as resin or polymer, which have good sealing property and also are flexibly compressible or stretchable. In FIG. 1D, a top plate 120 is placed on top of the separated chip 110' via an adhesive or bonding layer 125. The mounting of the top plate 120 on top of the separated chips 110' via the adhesive or bonding layer 125 is performed at a room temperature. The top plate 120 is composed of the identical material as the bottom PCB 105. The whole package is then cured in a vacuum chamber at a temperature of about 300 degrees Celsius. Because the top plate 120 and the bottom printed circuit board (PCB) 105 are made of same material, there will be no thermal expansion stress imposed on the IC chips 110' during thermal cycles encountered in subsequent packaging processes.

Figure 1E:
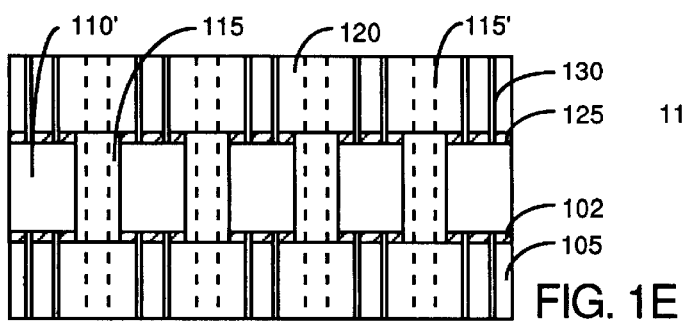
Figure 1F:
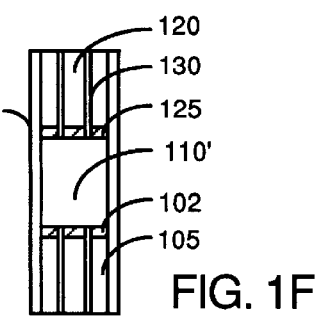

In FIG. 1E, processes employing photolithography technology are applied to form vias 130 at specific pre-designated locations through the bottom and top PCB plates 105 and 120 respectively. Then electric connections to the semiconductor IC chips 110' are formed through these vias. Filling these vias with conductive solder pasty forms the electric connections to the IC chips. Alternately, a solder dip or metal plating can be performed to form electric connections to the IC chips 110' through the vias 130. In FIG. 1F, a die separation operation is carried out by applying a saw blade of two to five mils to divide each of the chips 110' packaged between the top plate 120 and bottom plate 105 into a plurality of discrete IC devices 150.

According to FIGS. 1A to 1F, and above descriptions, this invention discloses an improved wafer level package, which includes a processed wafer 110 mounted on a first printed circuit board (PCB) carrier 105. The processed wafer 110 mounted on the PCB carrier board 105 includes a plurality of separated integrated circuit (IC) chips 110' divided by scribe-line gaps 115 wherein each of these scribe-line gaps 115 is filled with flexible gap-filling insulation material. In another preferred embodiment, the wafer-level package further includes a second PCB carried board 120 composed of same material as the first PCB carrier board 105 mounted on top of the wafer 110. In another preferred embodiment, the wafer-level package, which having the first and the second PCB carrier boards 105 and 120 respectively further includes a plurality of connection via 130. These connection vias 130 penetrate through the first and the second PCB carried board 105 and 120 respectively for forming electric connection to the IC chips 110' separated by the scribe-lines 115.

The present invention further discloses a method for carrying out a wafer-level packaging manufacturing process. The method includes the steps of (a) mounting a processed wafer 110 onto a first printed circuit board (PCB) carrier 105; (b) dividing the processed wafer 110 into a plurality of integrated circuit (IC) chips 110' by opening a plurality of scribe-line gaps 115 between each of the IC chips; (c) filling each of the scribe-line gaps 115 with flexible gap-filling insulation material; (d) mounting a top PCB carrier board 120 on top of the processed wafer 110 composed of identical material as that of the first PCB carrier board 105; and (d) forming a plurality of via-connections 130 by opening a plurality of vias penetrating the first and the second PCB carrier boards and filling the vias with conductive material for electrically connecting to the separated IC chips 110'.

According to FIG. 1F, this invention further discloses an integrated circuit (IC) chip package mounted on a first PCB carrier board. The IC chip package includes a second PCB carried board composed of same material as the first PCB carrier board mounted on top of the IC chip. The IC chip package further includes a plurality of connection via penetrating through the first and the second PCB carrier board for forming electric connection to the IC chip protected between the first and second PCB carrier board. In a preferred embodiment, the first and second PCB carrier board are multiple-layer PCB boards each having a plurality of via connectors penetrating through the multiple-layer boards for forming electric connections to the IC chip.

Figure 2:
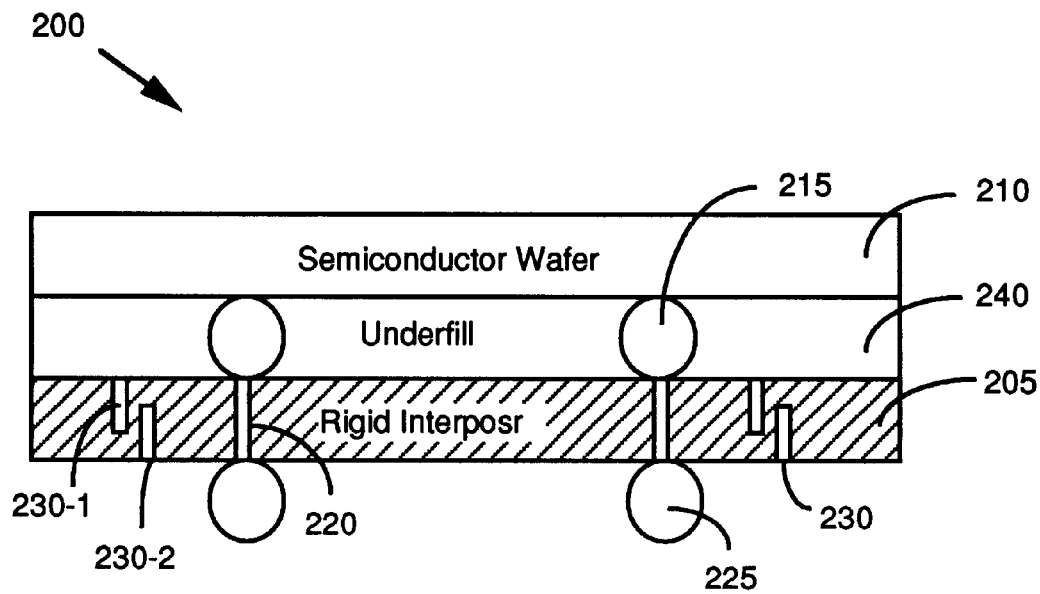
FIG. 2 is a cross sectional view of another preferred embodiment of this invention where a processed wafer is mounted on a rigid interposer provided with stress-relief and isolation trenches along the edges of each chip area.

FIG. 2 shows another preferred embodiment of this invention for packaging a plurality of chip scale package (CSP) IC devices on a wafer level. Instead of performing a die separation to divide the wafer 210 into a plurality of IC chips for packaging each chip individually, the wafer 210 is mounted to rigid interposer 205. The semiconductor wafer 210 is fully processed with solder bumps 215 ready for mounting onto the rigid interposer provided with via connections penetrating through the interposer 205 for interconnecting the solder bumps 215 to a ball grid array 225. The rigid interposer 205 further includes a chip stress-relief and isolation means 230 for relieving the stress during soldering and high temperature cycles. The chip stress-relief and isolation means 230 is formed on the edge of each chip such that the expansion or shrinking of the rigid interposer 205 for the area under a chip are isolated from that of neighboring chips. In the preferred embodiment shown in FIG. 2, the chip stress-relief and isolation means are two adjacent trenches 230-1 and 230-2 opened respectively from the top surface and bottom surface of the rigid interposer 205. With this rigid interposer 205, the wafer 210, which includes a plurality of processed CSP chips are mounted on before a die separation is carried out Soldering operations and operations involved high temperature cycles are performed without concerns that the expansion of the rigid interposer 205 at a higher temperature will cause the processed wafer 210 to crack due to stress caused by differences of thermal expansion. The stress caused by thermal expansion is relieved by the chip stress-relief and isolation means 230 and also by the under fill 240 disposed between the wafer 210 and the rigid interposer 201. The die separation can be carried out after the soldering and reflow processes performed on a wafer level to simplify the packaging processes such that time and cost savings can be achieved.

Figure 3:
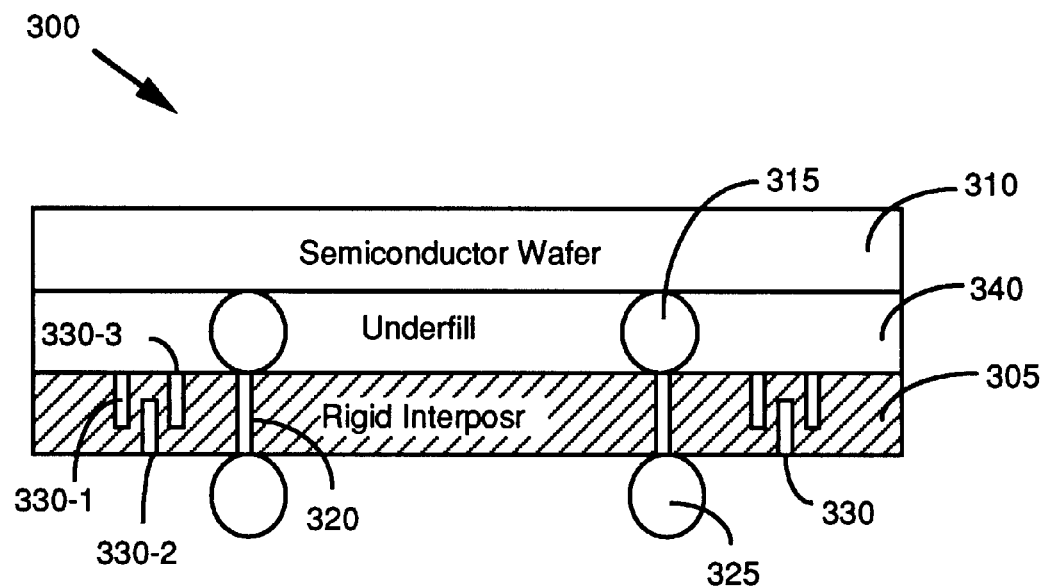
FIG. 3 is a cross sectional view of another preferred embodiment of this invention where a processed wafer is mounted on a rigid interposer provided with balanced stress-relief and isolation trenches along the edges of each chip area.

FIG. 3 shows another preferred embodiment of this invention for packaging a plurality of chip scale package (CSP) IC devices on a wafer level. Similar to that the packaging configuration shown in FIG. 2, instead of performing a die separation to divide the wafer 310 into a plurality of IC chips for packaging each chip individually, the wafer 310 is mounted to rigid interposer 305. The semiconductor wafer 310 is fully processed with solder bumps 315 ready for mounting onto the rigid interposer provided with via connections penetrating through the interposer 305 for interconnecting the solder bumps 315 to a ball grid array 325. The rigid interposer 305 further includes a balanced chip stress-relief and isolation means 330 for relieving the stress during soldering and high temperature cycles. The balanced chip stress-relief and isolation means 330 is formed on the edge of each chip such that the expansion or shrinking of the rigid interposer 305 for the area under a chip are isolated from that of neighboring chips. In the preferred embodiment shown in FIG. 3, the balanced chip stress-relief and isolation means are three adjacent trenches 330-1, 330-2 and 330-3. The trenches 330-1 and 330-2 are opened from the top surface and trench 330-3 is opened from the bottom surface of the rigid interposer 305. With this rigid interposer 305, the wafer 310, which includes a plurality of processed CSP chips are mounted on before a die separation is carried out. Soldering operations and operations involved high temperature cycles are performed without concerns that the expansion of the rigid interposer 305 at a higher temperature will cause the processed wafer 310 to crack due to stress caused by differences of thermal expansion. The stress caused by thermal expansion is relieved by the chip stress-relief and isolation means 330 and also by the under fill 340 disposed between the wafer 310 and the rigid interposer 305. The die separation can be carried out after the soldering and reflow processes performed on a wafer level to simplify the packaging processes such that time and cost savings can be achieved. The balanced chip stress-relief and isolation means 330 has the advantages that a balanced and symmetrical stress relief configuration is provided. The wafer will not become tilted or band because a more even thermal expansion is likely to occur with symmetrical stress relief around all edges of the die boundary on the rigid interposer 305.

According to above descriptions, this invention discloses a wafer-level package supported on a rigid interposing board. The wafer level package includes a processed wafer comprising a plurality of integrated circuit (IC) chips each having a plurality of solder bumps mounted onto the rigid interposing board. The rigid interposing board having a plurality of stress relief trenches open partially across a thickness of the rigid interposing board. In a preferred embodiment, each of the plurality of integrated circuit (IC) chips being separated by scribe-line gaps from neighboring IC chips wherein each of these scribe-line gaps is filled with flexible gap-filling insulation material. In a preferred embodiment, the rigid interposing board having a plurality of via connectors connected to the solder bumps of the IC chips. In another preferred embodiment, the rigid interposing board comprising plurality of rigid interposing layers provided with via connectors therein for connecting to the solder bumps of the IC chips. In another preferred embodiment, the rigid interposing board further comprising a plurality of board scribe lines corresponding to the scribe-line gaps dividing the chips for breaking into a plurality of packaged chips mounted and protected by the rigid interposing board broken along the board scribe lines. In another preferred embodiment, the rigid interposing board further comprising a plurality of balanced stress relief trenches opened from a top surface and a bottom surface of the rigid interposing board.

This invention also teaches a method for carrying out a wafer-level packaging manufacturing process. The manufacturing process comprising steps of (a) dividing a processed wafer into a plurality of integrated circuit (IC) chips by opening a plurality of scribe-line gaps between each of said IC chips and filling each of said scribe-line gaps with flexible gap-filling insulation material; (b) opening a plurality of stress relief trenches in a rigid interposing board and mounting said processed wafer with a plurality of solder bumps onto a top surface of said rigid interposing board; and (c)forming a plurality of via-connections by opening a plurality of vias penetrating said rigid interposing board and filling said vias with conductive material for electrically connecting to said solder bumps mounted on said top surface of said rigid interposing board.

Therefore, the present invention provides a new wafer level packaging method and configuration wherein stress imposed on the wafer caused by differences of thermal expansion is minimized. The limitations and difficulties encountered in the prior art are resolved. Specifically, a new wafer level packaging method and configuration is disclosed. The wafer is first mounted on a mounting and packaging carrier. The stress imposed on the wafer caused by differences of thermal expansion between the wafer and the mounting carrier is minimized by providing chip-isolation and stress relief configuration either on the wafer or on the chip-mounting carrier. The stress induced from differences in thermal expansion when carrying out the wafer-level packaging processes is relieved without transferring to the wafer. In a preferred embodiment, the wafer is first mounted on a mounting and packaging carrier. The wafer is then divided into individual chips by sawing the wafer along the predefined scribe lines and filled with flexible gap-filling and insulation materials. The stress imposed on the wafer caused by differences of thermal expansion between the wafer and the mounting carrier is minimized by providing chip-isolation and stress relief configuration with gaps between the chips filled with flexible gap-filling materials. The stress induced from differences in thermal expansion when carrying out the wafer-level packaging processes is relieved without transferring to the wafer. In another preferred embodiment, the wafer is first mounted on a mounting and packaging carrier, e.g., a rigid interposer. The rigid interposer is provided with chip stress-relief and isolation means having open trenches along the edges of areas under each individual chip. The stress imposed on the wafer caused by differences of thermal expansion between the wafer and the mounting carrier is isolated and relieved with the open trenches allow flexibility of expansions. Under-fill materials provided between the wafer and the rigid interposer also absorb the stress. The stress induced from differences in thermal expansion when carrying out the wafer-level packaging processes is relieved without transferring to the wafer.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A wafer-level package supported on a first PCB carrier board comprising:
   a processed wafer mounted on said first PCB carrier board wherein said processed wafer comprising a plurality of integrated circuit (IC) chips;
   each of said plurality of integrated circuit (IC) chips being separated by scribe-line gaps from neighboring IC chips wherein each of these scribe-line gaps is filled with flexible gap-filling insulation material; and
   a second PCB carried board composed of same material as said first PCB carrier board mounted on top of said processed wafer.

2. The wafer-level package of claim 1 further comprising:
   a plurality of connection via penetrating through said first and said second PCB carried board for forming electric connection to said IC chips separated by said scribe-line gaps.

3. The wafer-level package of claim 1 wherein:
   said first and second PCB carriers are multiple-layer PCB boards each having a plurality of via connectors penetrating through said multiple-layer boards for forming electric connections to said IC chips protected by said PCB carriers separated with said scribe-line gaps.

4. The wafer-level package of claim 1 wherein:
   each of said first and second PCB carriers having a plurality of PCB scribe lines corresponding to said scribe-line gaps dividing said chips for breaking into a plurality of packaged chips having each of said chips protected by a separate first and second PCB carriers broken along said PCB scribe lines.

5. A wafer-level package supported on a first PCB carrier board comprising:
   a processed wafer mounted on said first PCB carrier board wherein said processed wafer comprising a plurality of integrated circuit (IC) chips;
   each of said plurality of integrated circuit (IC) chips being separated by scribe-line gaps from neighboring IC chips wherein each of these scribe-line gaps is filled with flexible gap-filling insulation material;
   a second PCB carried board composed of same material as said first PCB carrier board mounted on top of said processed wafer; and
   a plurality of connection via penetrating through said first and said second PCB carried board for forming electric connection to said IC chips separated by said scribe-line gaps.

6. The wafer-level package of claim 5 wherein:
   said first and second PCB carriers are multiple-layer PCB boards each having a plurality of via connectors penetrating through said multiple-layer boards for forming electric connections to said IC chips protected by said PCB carriers separated with said scribe-line gaps.

7. The wafer-level package of claim 5 wherein:
   each of said first and second PCB carriers having a plurality of PCB scribe lines corresponding to said scribe-line gaps dividing said chips for breaking into a plurality of packaged chips having each of said chips protected by a separate first and second PCB carriers broken along said PCB scribe lines.

8. An integrated circuit (IC) chip package mounted on a first PCB carrier board comprising:
   a second PCB carried board composed of same material as said first PCB carrier board mounted on top of said IC chip; and
   a plurality of connection via penetrating through said first and said second PCB carrier board for forming electric connection to said IC chip protected between said first and second PCB carrier board.

9. The IC chip package of claim 8 wherein:
   said first and second PCB carrier board are multiple-layer PCB boards each having a plurality of via connectors penetrating through said multiple-layer boards for forming electric connections to said IC chip.

10. A wafer-level package supported on a rigid interposing board comprising:
    a processed wafer comprising a plurality of integrated circuit (IC) chips each having a plurality of solder bumps mounted onto said rigid interposing board;
    said rigid interposing board having a plurality of stress relief trenches open partially across a thickness of said rigid interposing board and said rigid interposing board having a plurality of via connectors connected to said solder bumps of said IC chips;
    each of said plurality of integrated circuit (IC) chips being separated by scribe-line gaps from neighboring IC chips wherein each of these scribe-line gaps is filled with flexible gap-filling insulation material;
    said rigid interposing board further comprising a plurality of board scribe lines corresponding to said scribe-line gaps dividing said chips for breaking into a plurality of packaged chips mounted and protected by said rigid interposing board broken along said board scribe lines; and
    an underfill material disposed above a top surface of said rigid interposing board between said solder bumps.

11. The wafer-level package of claim 10 wherein: said rigid interposing board comprising plurality of rigid interposing layers provided with via connectors therein for connecting to said solder bumps of said IC chips.

12. A wafer-level package supported on a rigid interposing board comprising:
    a processed wafer comprising a plurality of integrated circuit (IC) chips each having a plurality of solder bumps mounted onto said rigid interposing board; and
    said rigid interposing board having a plurality of stress relief trenches open partially across a thickness of said rigid interposing board.

13. The wafer-level package of claim 12 wherein:
    each of said plurality of integrated circuit (IC) chips being separated by scribe-line gaps from neighboring IC chips wherein each of these scribe-line gaps is filled with flexible gap-filling insulation material.

14. The wafer-level package of claim 12 wherein:
    said rigid interposing board having a plurality of via connectors connected to said solder bumps of said IC chips.

15. The wafer-level package of claim 12 wherein:
said rigid interposing board comprising plurality of rigid interposing layers provided with via connectors therein for connecting to said solder bumps of said IC chips.

16. The wafer-level package of claim 12 wherein:
said rigid interposing board further comprising a plurality of board scribe lines corresponding to said scribe-line gaps dividing said chips for breaking into a plurality of packaged chips mounted and protected by said rigid interposing board broken along said board scribe lines.

17. The wafer-level package of claim 12 wherein:
said rigid interposing board further comprising a plurality of balanced stress relief trenches opened from a top surface and a bottom surface of said rigid interposing board.

18. The wafer-level package of claim 12 further comprising:
an underfill material disposed above a top surface of said rigid interposing board between said solder bumps.

19. A method for carrying out a wafer-level packaging manufacturing process comprising:
mounting a processed wafer onto a first printed circuit board (PCB) carrier;
dividing said processed wafer into a plurality of integrated circuit (IC) chips by opening a plurality of scribe-line gaps between each of said IC chips;
filling each of said scribe-line gaps with flexible gap-filling insulation material;
mounting a top PCB carrier board on top of said processed wafer composed of identical material as that of said first PCB carrier board; and
forming a plurality of via-connections by opening a plurality of vias penetrating said first and said second PCB carrier boards and filling said vias with conductive material for electrically connecting to said separated IC chips.

20. A method for carrying out a wafer-level packaging manufacturing process for manufacturing a plurality of packaged integrated circuit chips comprising:
mounting a processed wafer onto a first printed circuit board (PCB) carrier;
dividing said processed wafer into a plurality of integrated circuit (IC) chips by opening a plurality of scribe-line gaps between each of said IC chips;
filling each of said scribe-line gaps with flexible gap-filling insulation material;
mounting a top PCB carrier board on top of said processed wafer composed of identical material as that of said first PCB carrier board;
forming a plurality of via-connections by opening a plurality of vias penetrating said first and said second PCB carrier boards and filling said vias with conductive material for electrically connecting to said separated IC chips; and
breaking said first and second PCB carrier boards and said wafer along said scribe-line gaps for producing a plurality of packaged IC chips packaged with said first and second PCB carrier boards.

* * * * *